United States Patent
Ulen et al.

(10) Patent No.: US 7,988,459 B2
(45) Date of Patent: Aug. 2, 2011

(54) UNIFIED RETENTION MECHANISM FOR CPU/SOCKET LOADING AND THERMAL SOLUTION ATTACH

(75) Inventors: Neal Ulen, Yelm, WA (US); David Llapitan, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/459,312

(22) Filed: Jun. 30, 2009

(65) Prior Publication Data

US 2010/0330824 A1 Dec. 30, 2010

(51) Int. Cl.
*H01R 13/62* (2006.01)
*H01R 13/00* (2006.01)

(52) U.S. Cl. ............... 439/73; 439/331; 439/487

(58) Field of Classification Search ............... 439/71, 439/73, 331, 485, 487
See application file for complete search history.

(56) References Cited

U.S. PATENT DOCUMENTS

| | | | | |
|---|---|---|---|---|
| 4,063,791 | A * | 12/1977 | Cutchaw | 439/331 |
| 4,598,965 | A * | 7/1986 | Bricaud et al. | 439/329 |
| 5,938,454 | A * | 8/1999 | Brodsky et al. | 439/71 |
| 6,022,225 | A * | 2/2000 | Chapin et al. | 439/73 |
| 6,585,534 | B2 * | 7/2003 | Llapitan et al. | 439/327 |
| 6,722,908 | B2 * | 4/2004 | Llapitan et al. | 439/327 |
| 7,470,128 | B2 * | 12/2008 | Ju | 439/73 |
| 7,510,418 | B1 * | 3/2009 | Scott et al. | 439/331 |
| 7,666,021 | B2 * | 2/2010 | Ma | 439/331 |
| 2008/0153338 | A1 * | 6/2008 | Ju | 439/331 |
| 2008/0220643 | A1 * | 9/2008 | Zhang | 439/331 |
| 2010/0330824 | A1 * | 12/2010 | Ulen et al. | 439/73 |

* cited by examiner

*Primary Examiner* — James Harvey
(74) *Attorney, Agent, or Firm* — Kevin A. Reif

(57) ABSTRACT

An apparatus for removably retaining an IC package in engagement with a socket such that the contacts of both the IC package and the socket are properly engaged is disclosed. Specifically, a universal retention mechanism (URM) which may be fabricated in a diecast material, may comprise a retention frame to engage a socket. A load plate hinged to the retention frame may be caused to press the socket and IC package together through force selectively applied through the use of a load lever. In addition, the frame may contain features to attach a thermal solution (e.g. a heat sink or other cooling device) directly to the frame thus eliminating the need to attach it directly to a motherboard or through a backplate.

20 Claims, 5 Drawing Sheets

UNIFIED RETENTION MECHANISM FOR CPU/SOCKET LOADING AND THERMAL SOLUTION ATTACH

FIELD OF THE INVENTION

Embodiments of the present invention are directed to sockets and, more particularly, to sockets for holding an integrated circuit package which may include attachment for a heat sink device.

BACKGROUND INFORMATION

Semiconductor manufacturers currently employ two primary technologies for central processing unit (CPU) packages. The first is referred to as pin grid array (PGA) sockets and the second is commonly referred to as land grid array (LGA) sockets.

PGA packages typically have a greater assembly and material cost due to the pins. In addition, there are limitations on the pin pitch and number of pins that can realistically be manufactured.

LGA packages may be less costly since there may be no holes, rather, pins on the LGA touch contact points on the underside of the CPU and are retained in the socket by either an integral loading scheme such as the direct socket loading (DSL) for socket T or an independent loading mechanism (ILM) with a back plate as adopted for socket B. Socket T and Socket B refer to two types of currently used socket variations.

Unfortunately, the DSL mechanism may result in solder joint reliability issues in various shock, vibration and power cycle conditions. In addition, it may pose challenges with scalability to accommodate larger numbers of contacts and may not easily lend itself to low profile designs.

The ILM, on the other hand, may utilize a larger back plate on the underside of the board with holes or attachment points drilled through the board for attachment of the socket and a second set of holes out further for attachment of a heatsink which may render it less desirable in system designs that have minimal clearance between the back of the board and the chassis.

Thus, semiconductor manufacturers are constantly striving to find affordable new ways to secure a CPU reliably in a confined area.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments. For example, although embodiments are discussed with reference to an IC device having a package with land grid array (LGA) contacts, it will be readily apparent to those skilled in the art that other embodiments having other types of contacts may be employed without departing from the spirit and scope of the invention as hereinafter claimed.

An apparatus for removably retaining an IC package in engagement with a socket such that the contacts of both the IC package and the socket are properly engaged is disclosed. Specifically, a universal retention mechanism (URM) which may be fabricated in a diecast material, may comprise a retention frame to engage a socket. A load plate hinged to the retention frame may be caused to press the socket and IC package together through force selectively applied through the use of a load lever. In addition, the frame may contain features to attach a thermal solution (e.g. a heat sink or other cooling device) directly to the frame thus eliminating the need to attach it directly to a motherboard or through a backplate.

Figure 1:
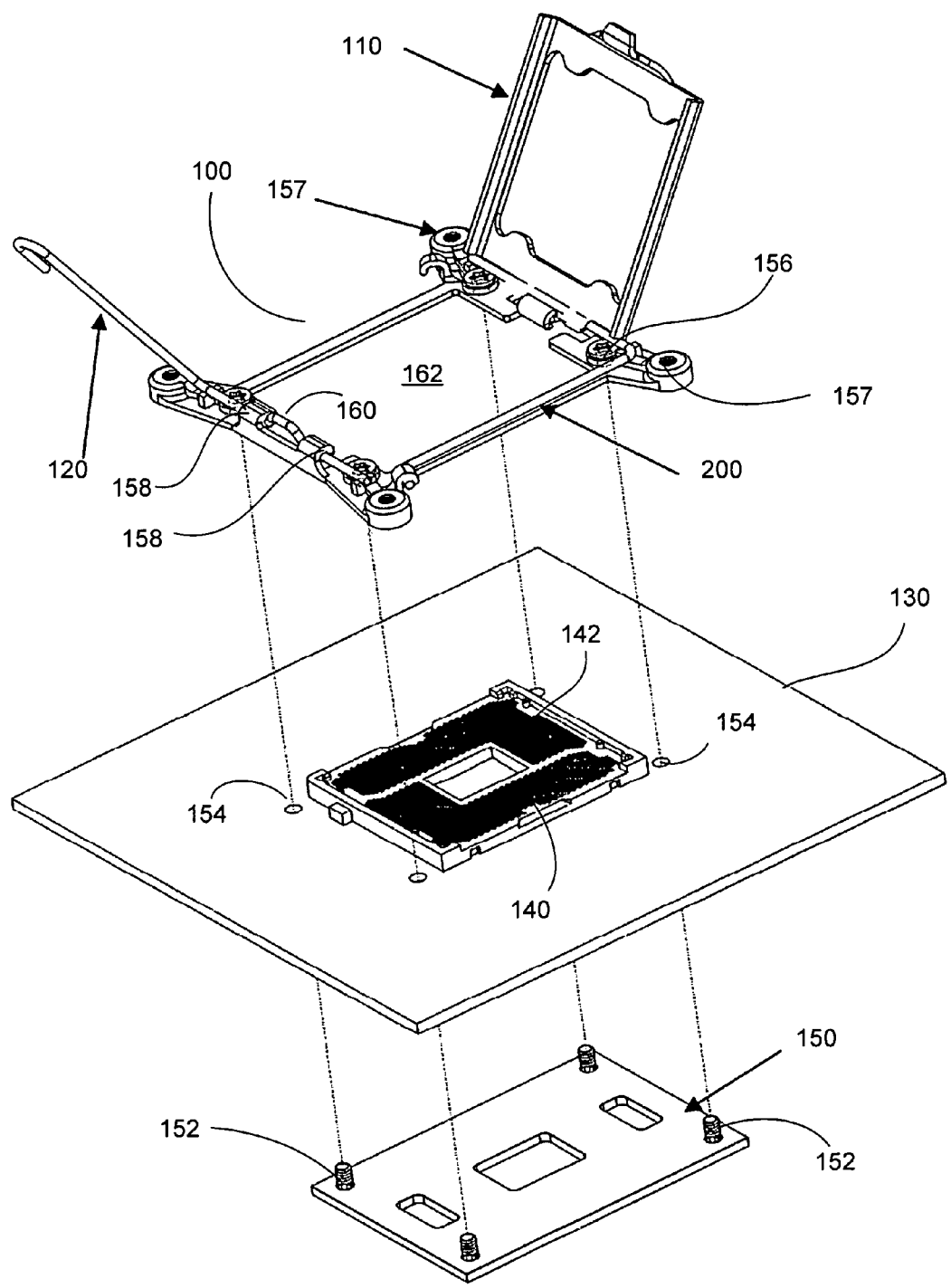
FIG. 1 is a plan view of a diecast unified retention mechanism (URM) for securing a CPU package in a socket prior to assembly.

Referring now to FIG. 1, there is shown one embodiment of an assembly of an IC to a socket. The assembly may comprise a retention frame 100, load plate 110, load lever 120, circuit board 130, which may be, for example a motherboard, and a socket 140. Retention frame 100, load plate 110 and load lever 120 cooperate to forcibly press together IC (not shown) and socket 140 so as to press contacts on topside 142 of socket 140 into engagement with contacts on underside of an IC package.

The retention frame 100 may be fastened, for example, via a back plate 150 having fasteners, such as threaded studs 152, which may fit through holes 154 in the circuit board 130 and into corresponding openings 156 in the retention frame 100. In addition, according to one embodiment, the thermal solution attachment points 157 may be integrally formed with the retention frame 100. Hence, the need for additional holes or fasteners in the circuit board 130 is eliminated for attaching a thermal solution device, such as a heat sink or other cooling device. One advantage of this scheme is that the back plate may be of a reduced size as compared to conventional backplate since the back plate 150 may no longer need to also support fasteners for the thermal solution.

Prior to engagement, load lever 120 may be positioned in a load lever channel 158 on the retention frame 100 with a load point 160 of lever 120 protruding through load point channel 158. The socket 140 may attach to circuitboard 130 via any of a number of known techniques for soldering contacts (not shown) on underside of socket 140 to contacts on socket surface location of circuitboard 130. As socket 140 is attached to circuitboard 130, socket 140 is positioned in the open area 162 formed through the middle of retention frame 100.

Figure 2:
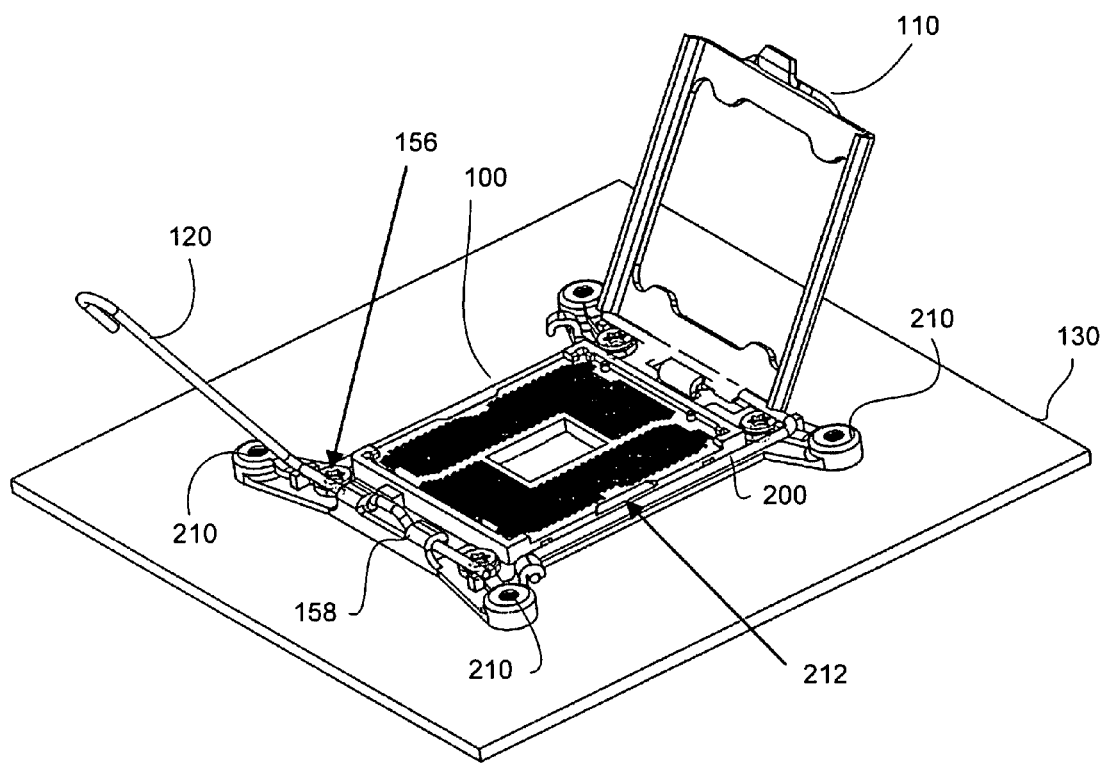
FIG. 2 is a is a plan view of the URM attached to a mother board.

Referring now to FIG. 2, there is shown the retention frame 100 fastened to the circuit board 130. Embodiments may comprise two wire bail spring portions along either side of the retention frame 100. The first spring portion may comprise the load lever 120 itself and may be hinged to be used to engage and close the load plate 110. The second wire bail spring 200 may be captive to the retention frame 100. These two springs 120 and 200 may serve to better or more evenly distribute load to the load plate 110.

To act as an attach frame for thermal solutions, the outer attach frame 100 may contain features 210 to attach a thermal solution. These features may accommodate, for example screws, or via tooless features such as spring loaded lever arms. A screw attach scheme could be accomplished via direct tap into the diecast or with threaded inserts. A finger slot 212 or tool slot may be provided in order to provide a access point for grabbing the IC, such as a CPU package for ease of removal.

Figure 3A:
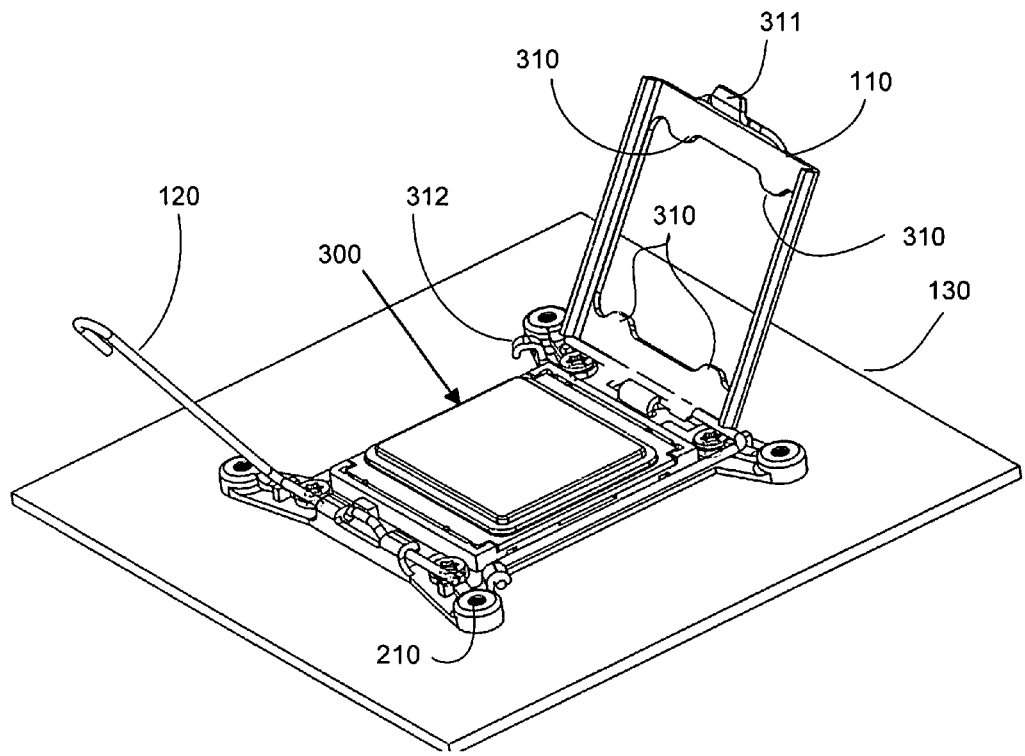
FIGS. 3A-3C are plan views of the URM demonstrating the seating and securing of a CPU package in the URM.
Figure 3B:
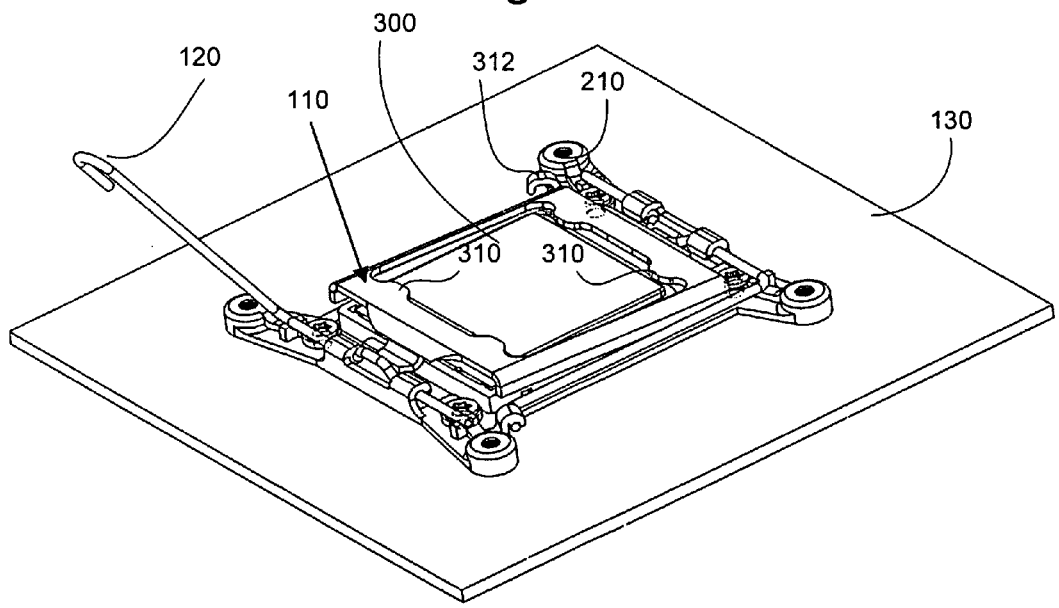

FIG. 3A shows an IC, such as a CPU 300 inserted or socketed into the universal retention mechanism according to one embodiment. FIG. 3B shows the hinged load plate 110 rotated towards a closed position to secure the CPU 300 within the socket. Note, as shown, the load plate 110 may generally include four primary load points 310 which may contact the CPU 300 to maintain a downwards force to secure the CPU in place.

Figure 3C:
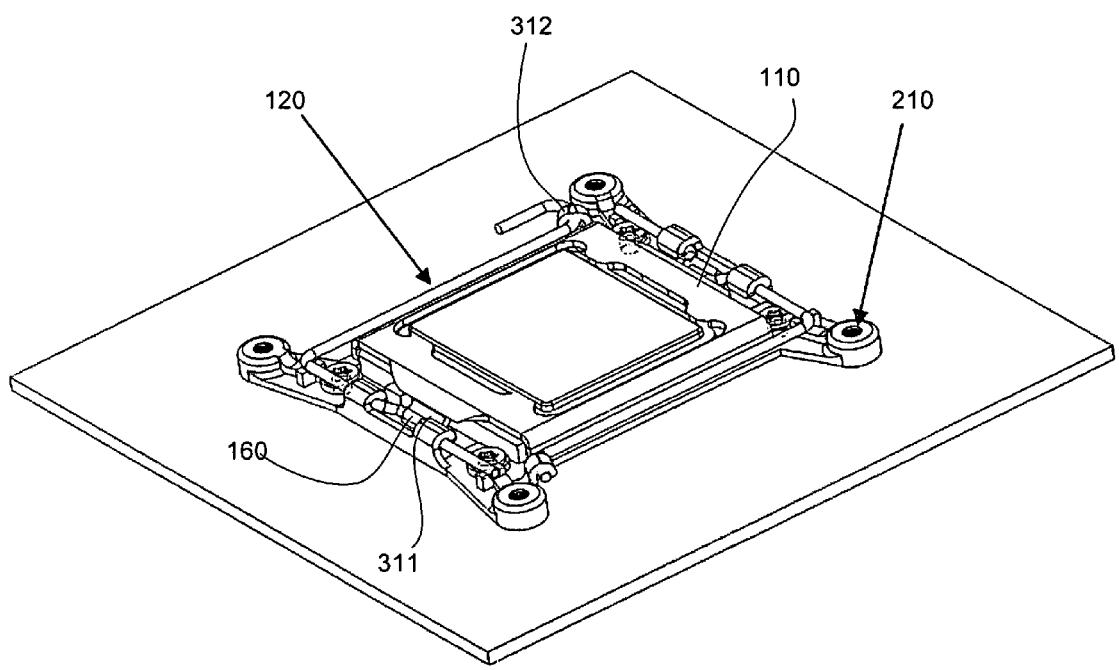

As demonstrated in the FIG. 3C, once the load plate is in a closed position load lever 120 is pivoted, causing load point 160 of load lever 120 to engage load point 311 on the load plate 110 and the lever handle 120 may engage lever catch 312 to lock the load plate 110, and thus the CPU 300 in place ensuring good electrical connection in the socket 142. Of course, to remove the CPU from the socket, one only need to unlock and rotate the load lever 120 upwards, open the hinged load plate 110 and may then use the slot 212 to grab and lift the CPU 300 from the socket 142 (FIG. 1).

Figure 4A:
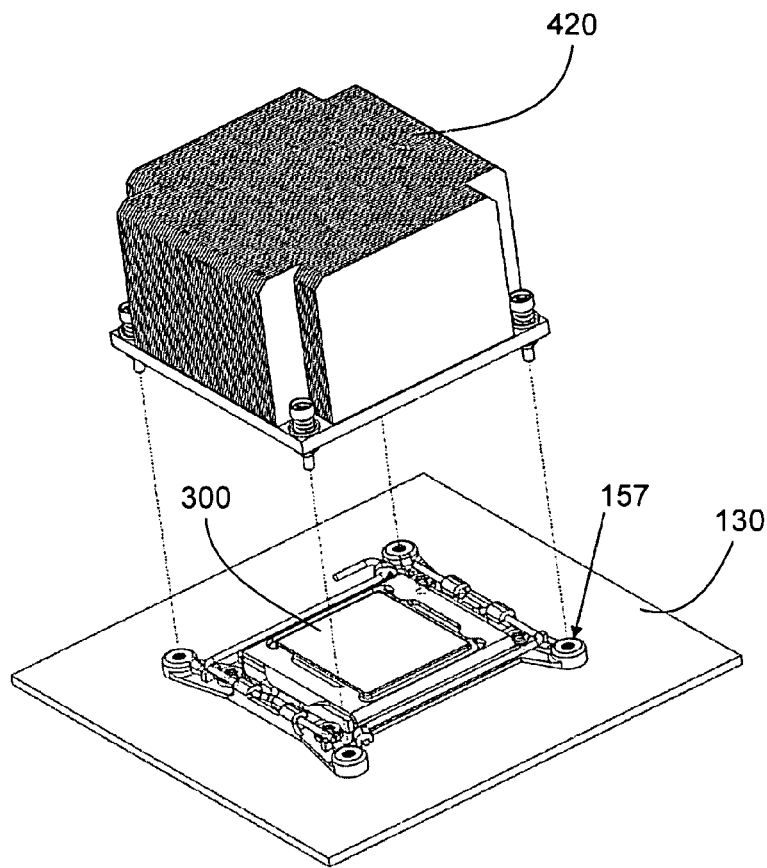
FIGS. 4A-4B are plan views showing attachment of a thermal solution, such as a heat sink, to the URM.
Figure 4B:
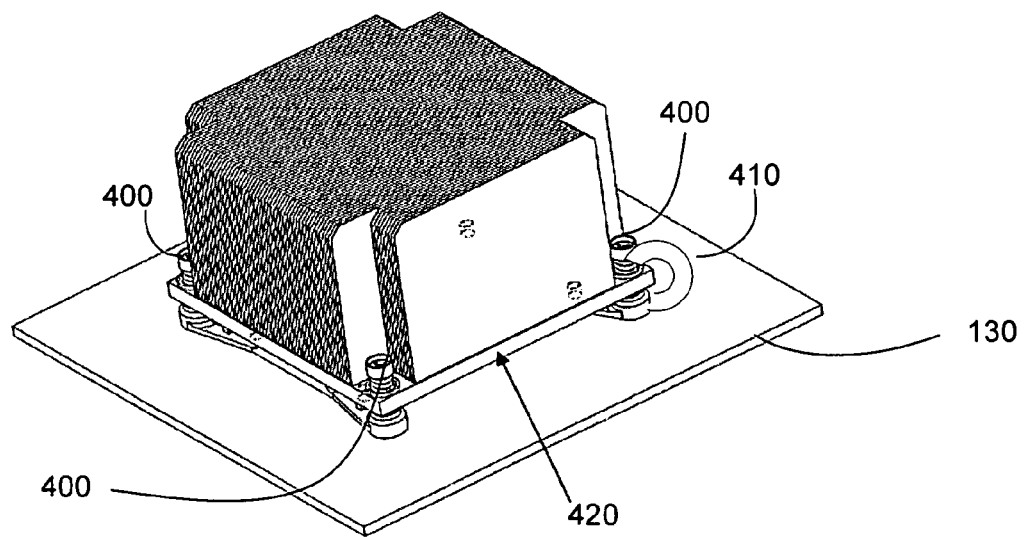

Referring now to FIGS. 4A and 4B, the universal retention mechanism according to embodiments of the present invention may also include thermal solution retention points 157. While four such points are shown, one in each corner, more or less at different locations may be feasible depending on the shape of the universal retention mechanism which may be based on the available space of the board 130. As shown in FIG. 4A, the thermal solution 420, used to cool the CPU 300 which generally generates unwanted heat during use, may be simply attached to the retention points 157 as shown and held in place, for example by screws as shown. Alternatively, rather than screws, a spring loaded retention feature 410 or other fastening means may be used.

There are many advantages to embodiments of the present invention as will be appreciated by those skilled in the art. The four point load plate 110 distributes load around the integrated heat spreader. The dual spring system allows for leveling of the four point load plate 110 on the integrated heat spreader. Forming the socket frame by die cast methods allows for a feature rich solution. First, it allows for a topside thermal solution to attach to a rigid structure. This removes the motherboard thickness dependency from the stackup. For example, the design of the thermal solution retention may accommodate a range of board thicknesses (0.062"-0.100") which may be a design requirement in server designs. This may also be advantageous in designs where the socket contact loading is shared between the load plate and the thermal solution.

As a further advantage, embodiments may allow for the reduction to four holes in Motherboard, verses six to eight holes, with the outer 2-4 holes for thermal solution attachment no longer necessary. This may alleviate motherboard routing issues during trace breakout from the socket. This may be needed as signal and power requirements increase in future platforms. Further, the design allows for increased finger clearance for socket pick and place cap removal and increased finger clearance for socketing of CPU.

Tall sheetmetal walls around socket body, as in prior designs may be eliminated allowing access to socket finger groove for grabbing the CPU. In addition, diecast generally has tighter tolerances than sheet metal. This equates to less load variation for the load frame and thermal solution.

Embodiments also may reduced the cost of the backplate as a larger backplate may not be needed to accommodate thermal attach points. Further, the smaller backplate may allow for memory to be placed closer to the CPU.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a retention frame being generally rectangular in shape;
   a load plate hinged on one side of the retention frame;
   a load lever hinged on an opposite side of the load plate;
   attachment points to attach the retention frame to a separate backplate; and
   thermal solution attachment points integral with the retention frame.

2. The apparatus as recited in claim 1, further comprising:
   a first spring arm positioned along one side of the retention frame between the hinged load plate and the hinged load lever; and
   the load lever acting as a second spring arm when in a locked position positioned on an opposite side of the retention frame from the first spring arm.

3. The apparatus as recited in claim 1 further comprising:
   four load points integral with the load plate to urge an integrated circuit package into a socket.

4. The apparatus as recited in claim 1 further comprising:
   a load point rotatable by the load lever to engage a load point on the load plate to lock the load plate in a closed position.

5. The apparatus as recited in claim 1 wherein the thermal solution attachment points are positioned in two or more corners of the retention frame.

6. The apparatus as recited in claim 5 wherein the retention frame is diecast.

7. The apparatus as recited in claim 1 further comprising:
   a socket to fit within an open space in the retention frame, wherein the socket comprises a finger slot for removal of an integrated circuit.

8. A method, comprising:
   diecasting a retention frame including thermal solution retention attachment points;
   hinging a load plate on one side of the retention frame;
   hinging a load lever on an opposite side of the load plate; and providing attachment points to attach the retention frame to a separate backplate.

9. The method as recited in claim 8, further comprising:
positioning a first spring arm along one side of the retention frame between the hinged load plate and the hinged load lever; and
rotating the load lever to a closed position to allow the load lever to act as a second spring arm positioned on an opposite side of the retention frame from the first spring arm.

10. The method as recited in claim 8 further comprising:
providing four load points integral with the load plate to urge an integrated circuit package into a socket.

11. The method as recited in claim 8 further comprising:
attaching a socket to a board;
securing the retention frame over the socket with a backplate;
placing an integrated circuit package in the socket;
closing the load plate over the integrated circuit package;
rotating the load lever to lock the load plate in a closed position causing the integrated circuit package to seat within the socket.

12. The method as recited in claim 8, wherein the thermal attachment points are positioned in two or more corners of the retention frame.

13. The method as recited in claim 12, further comprising:
attaching a thermal solution to the thermal solution attachment points integral with the retention frame.

14. The method as recited in claim 12 wherein the thermal solution is a heat sink.

15. The method as recited in claim 13 wherein the thermal solution attachment comprise threads for screw attachment.

16. The method as recited in claim 13 wherein the thermal attachment points accommodate a spring retention mechanism.

17. A system for socketing a central processing unit package and thermal solution to a motherboard, comprising:
a socket attached to a mother board having a set of holes;
a backplate under the motherboard;
a retention frame positioned around the socket and attached to the backplate through the set of holes; and
a thermal solution attachment point integral with the retention frame.

18. The system as recited in claim 17, further comprising:
a load plate hinged to the retention frame; and
a load lever for locking the load plate over a central processing unit package seated in the socket when the load lever is in a closed position.

19. The system as recited in claim 18 further comprising:
a thermal solution secured to the thermal solution attachment point over the load plate.

20. The system as recited in claim 18 wherein the retention frame is diecast.

\* \* \* \* \*